United States Patent [19]

Solo de Zaldivar

[11] 4,420,872

[45] Dec. 20, 1983

[54] METHOD OF MANUFACTURING A SEMICONDUCTOR DEVICE

[75] Inventor: Jose Solo de Zaldivar, Zurich, Switzerland

[73] Assignee: U.S. Philips Corporation, New York, N.Y.

[21] Appl. No.: 333,353

[22] Filed: Dec. 22, 1981

[30] Foreign Application Priority Data

Dec. 23, 1980 [NL] Netherlands .......................... 8006996

[51] Int. Cl.³ .................... H01L 21/265; H01L 21/31
[52] U.S. Cl. .................................... 29/571; 29/576 B;
29/577 C; 29/578; 29/590; 148/1.5; 148/187;
156/628; 156/653; 156/657; 156/662; 357/23;
357/41; 357/42; 357/91; 427/94
[58] Field of Search ................. 29/571, 576 B, 577 C,
29/578, 590, 591; 148/1.5, 187; 156/628, 653,
657, 662; 427/94; 357/23 S, 41, 42, 91

[56] References Cited

U.S. PATENT DOCUMENTS

| | | | |
|---|---|---|---|
| 3,849,216 | 11/1974 | Salters | 148/187 |
| 3,999,213 | 12/1976 | Brandt et al. | 357/42 |
| 4,113,515 | 9/1978 | Kooi et al. | 29/578 X |
| 4,139,402 | 2/1979 | Steinmaier et al. | 29/571 X |
| 4,221,045 | 9/1980 | Godejahn | 29/571 |
| 4,266,985 | 5/1981 | Ito et al. | 29/578 X |
| 4,268,321 | 5/1981 | Meguro | 29/571 X |

FOREIGN PATENT DOCUMENTS 7902878  3/1979  Netherlands .

*Primary Examiner*—W. G. Saba
*Attorney, Agent, or Firm*—Thomas A. Briody; Robert T. Mayer; Steven R. Biren

[57] ABSTRACT

A method of manufacturing an integrated circuit having at least an insulated gate field effect transistor (IGFET). Provided on the silicon surface are successively a gate oxide layer and a doped silicon layer which are patterned by etching by means of a silicon nitride-containing mask which comprises the gate electrode(s) and interconnections. Nitrogen ions are implanted in the surface parts not underlying the mask. By thermal oxidation only the edges of the silicon pattern are oxidized. By ion implantation the source and drain zones are formed, the gate electrodes serving as an implantation mask. If desired, the threshold voltage may then be adjusted by ion implantation in the channel region via the gate electrode. The invention is of particular importance for the manufacture of complementary IGFET pairs in which a transistor is provided in a bowl-shaped zone which is bounded by a p-n junction terminating at the surface between a boron-doped p-type and an adjoining phosphorus-doped n-type channel stopper zone FIG. 15.

10 Claims, 17 Drawing Figures

METHOD OF MANUFACTURING A SEMICONDUCTOR DEVICE

BACKGROUND OF THE INVENTION

The invention relates to a method of manufacturing a semiconductor device with a semiconductor body of silicon comprising at least an insulated gate field effect transistor in which a silicon oxide layer is provided on the surface of the silicon body, on which oxide layer a doped silicon layer is provided, after which the silicon layer is provided with a masking layer and the masking layer and the underlying silicon layer are etched into a pattern comprising at least a gate electrode, and nitrogen ions are then implanted in the parts of the silicon surface not underlying the silicon layer, after which the exposed parts of the silicon pattern are thermally oxidized and source and drain zones are then formed by ion implantation in parts of the silicon surface not underlying the silicon pattern.

A method of the kind described above is known from Netherlands Patent Application No. 7902878 (laid open to public inspection).

Various methods have been developed for the self-registering manufacture of insulated gate field effect transistors, all of which method have in common that the gate electrode, either with or without the mask used for its formation is used as a doping mask in doping the source and drain zones. The gate electrode usually consists of polycrystalline silicon, and in order to prevent shortcircuits between the gate electrode and the source and drain zones, at least the edge of the gate electrode must be covered with an insulating layer, for example by thermal oxidation. To prevent difficulties in doping the source and drain zones and in forming contact windows on said zones, it is desirable that during the thermal oxidation of the gate electrode the parts of the silicon surface not underlying the gate electrode should be protected against oxidation.

According to a first method described in U.S. Pat. No. 3,843,216 this may be done by covering the silicon surface, prior to providing the gate electrode of polycrystalline silicon, with a silicon nitride-containing layer masking against oxidation, on which layer the gate electrode is provided, after which the whole gate electrode is covered with a thermal oxide layer. One of the disadvantages of this method, however, is that the dielectric below the gate electrode comprises silicon nitride, which may sometimes give rise to instabilities and to further undesired effects.

Therefore a second method has been developed as described in the above-mentioned Netherlands Patent Application No. 7902878. In this method no silicon nitride layer is used but nitrogen ions are implanted in the surface regions destined for the source and drain zones, the gate electrode being masked against said implantation. In the subsequent thermal oxidation in which the gate electrode is entirely covered with an oxide layer, the parts of the silicon surface implanted with nitrogen ions and present beside the gate elctrode are protected against oxidation.

For the self-registering manufacture of field effect transistors of very small dimensions in monolithic integrated circuits of large packing density, neither of these methods provides a satisfactory solution. First of all, in order not to run the risk of the polycrystalline silicon being oxidized through entirely, the thermal oxidation must be very readily controlled and the silicon layer must be comparatively thick. However, such thick layers are difficult to etch very narrowly in a reproducible manner. On the other hand, the oxide on the gate electrode must not be too thin either. A deposited polycrystalline silicon layer has a rough surface and an oxide layer grown thereon, when it is too thin, shows defects ("pin holes") so that shortcircuits with, for example, a metallization may occur.

However, a thick oxide layer on the gate electrode has an important disadvantage. In fact, in order to determine the threshold voltage, an ion implantation in the channel region is usually necessary. In the case of field effect transistors of very small dimensions said implantation will preferably be carried out as late as possible so as to minimize the number of subsequent heating steps which may result in an undesired further diffusion of the doping atoms already present. Therefore this implantation will preferably be carried out after the provision of the gate electrode and through the gate electrode. In the presence of a thick oxide layer on the gate electrode, however, this is substantially impossible. Finally, the presence of thick silicon layers and silicon oxide layers may present problems with respect to the "stepcoating" by further insulating layers provided subsequently so that inter alia a metal track which crosses the gate electrode or the interconnection paths belonging to the silicon pattern may be interrupted.

SUMMARY OF THE INVENTION

One of the objects of the present invention is to provide a method for the self-registering manufacture of a semiconductor device with an electrically stable insulated gate field effect transistor of very small dimensions in which a good step coating is obtained and in particular thick oxide layers on the gate electrode are avoided, while also in comparison with the known methods an accurately aligned contact hole mask may be omitted.

The invention is based inter alia on the recognition of the fact that these objects can be obtained by using a suitably chosen combination of nitrogen implantation and silicon nitride as oxidation-inhibiting factors.

According to the invention, a method of the kind described above is characterized in that said masking layer is a silicon nitride-containing layer which masks underlying silicon layer against the thermal oxidation.

The method according to the invention has important advantages. Since the gate electrode is not oxidized in the direction of thickness, a comparatively thin silicon layer may be used for the gate electrode and the interconnection paths, which layer maintains its original thickness throughout the whole process. Since furthermore a silicon nitride layer has a sufficiently high density also in the case of small thickness and shows practially no defects even when deposited on a comparatively rough surface, a comparatively thin silicon nitride layer may also be used as a masking on the silicon layer. As a result of this the possibility is created to perform an ion implantation through the gate electrode and the insulating layer present thereon into the channel region without problems so as to adjust the threshold voltage. Since no silicon nitride is present below the gate electrode a stable characteristic is obtained while as a result of the comparatively small overall thickness of the silicon layer and the insulating layer present thereon a good step coating by further insulating layers and by crossing conductor tracks is ensured.

The invention furthermore provides the possibility of using very small nitrogen ion concentrations. Applicants have found that the oxidation-inhibiting influence of nitrogen ions strongly depends on the doping of the silicon and that such an implantation in a comparatively low ion dose of, for example, $3.10^{15}$ ions per $cm^2$ or less is no longer effective on a highly doped gate electrode of polycrystalline silicon. In the case of very shallow source and drain zones having a depth of, for example, 0.3–0.5 μm, however, higher nitrogen ion doses are undesired due to the high density of the resulting crystal defects. Moreover, a further insulating layer would have to be provided on the gate electrode so as to avoid contact with crossing metal tracks.

According to an important preferred embodiment, after the formation of the source and drain zones, a further insulating layer, for example, a pyrolytically deposited silicon oxide layer, is provided on the surface and further layer contact windows are then etched therein. Since the etching rates of silicon oxide and silicon nitride differ considerably in most of the etching processes, the silicon pattern will be masked against said etching process in places which are present below the nitride, so that said masking and etching steps are less critical than when, for example, the silicon pattern alone is covered with an oxide layer.

The invention is of particular interest for the manufacture of integrated circuits with complementary insulated gate field effect transistors in which both transistors are surrounded by a pattern of at least partly counter-sunk oxide and in which one of the transistors is provided in a region which within the semiconductor body is fully surrounded by a substrate region of the opposite type and forms a p-n junction therewith terminating at the countersunk oxide pattern. In addition to the measures already mentioned, the compactness of such a structure may be considerably increased by using borondoped and phosphorus-doped channel stopping zones, as will be described in detail hereinafter.

The masking layer on the silicon pattern preferably consists of a very thin thermal oxide layer and a silicon nitride layer present thereon. The thickness of the nitride layer advantageously is at most 60 nm, that of the thermal oxide layer at most 20 nm and that of the silicon pattern at most 350 nm. Such thin layers can be etched very narrowly without many problem.

BRIEF DESCRIPTION OF THE DRAWING

The invention will now be described in greater detail with reference to the drawing, in which.

The figures are diagrammatic and not drawn to scale. In the cross-sectional views semiconductor zones of the same conductivity type are shaded in the same direction. Corresponding parts usually have the same reference numerals.

DESCRIPTION OF THE PREFERRED EMBODIMENTS

Figure 1:
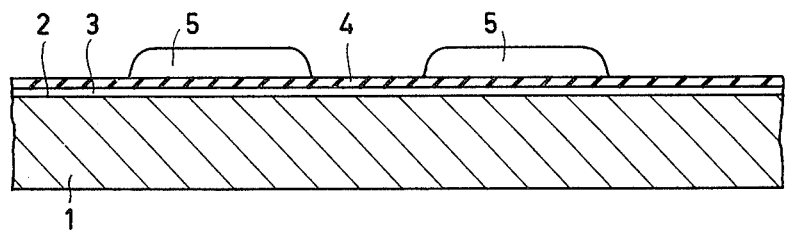
FIGS. 1 to 15 are diagrammatic cross-sectional views of successive stages of a method of manufacturing a semiconductor device according to the invention.

FIGS. 1 to 15 are diagrammatic cross-sectional views of successive stages of a method according to the invention. In this example, complementary insulated gate field effect transistors are manufactured, although the method according to the invention is also very suitable for the manufacture of discrete field effect transistors. The starting material (see FIG. 1) is a silicon wafer 1, in this example an n-type silicon wafer, having a resistivity of approximately 4 Ohm.cm (doping concentration approximately $1.2 \times 10^{15}$ atoms($cm^3$), a thickness of approximately 500 μm and a <100> oriented surface 2. The surface is coated with a thin oxide layer 3 (thickness approximately 30 nm) by thermal oxidation. An approximately 120 nm thick silicon nitride layer 4 is then deposited thereon in known manner from a gas mixture containing $NH_3$ and silane ($SiH_4$).

In order to form an oxide pattern the silicon nitride layer 4 is covered with a photoresist mask 5 (FIG. 1) in the regions where the complementary field effect transistors are to be provided.

The parts of the layers 3 and 4 not covered by the photoresist mask are then removed by etching. Etching may be done in any manner, for example, by means of known etching liquids. Preferably, however, the silicon nitride layer 4 is removed by plasma etching, after which the oxide layer 3 is removed by etching in a buffered HF solution.

Figure 2:
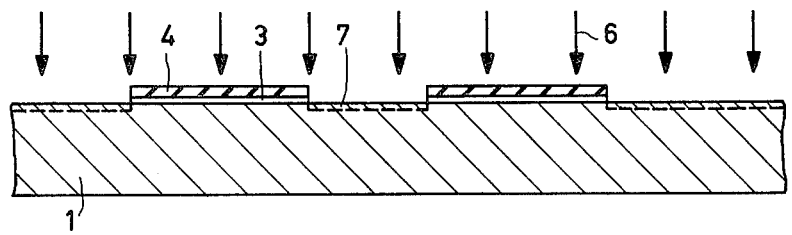

After removing the photoresist layer in an oxygen plasma, donor ions 6 are implanted to form the channel stopper zones 7, the layers 3 and 4 masking against said implantation, as shown in FIG. 2. As donor ions arsenic ions, for example, may be used. Preferably, however, phosphorus ions are implanted in this example, for reasons which will become apparent hereinafter. The implantation takes place at an energy of 50 KeV and a dose of $3 \times 10^{12}$ $P^+_{31}$ ions per $cm^2$.

Figure 3:
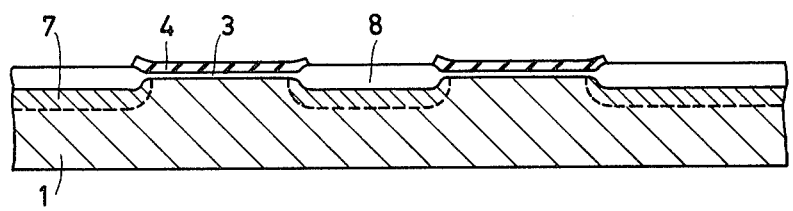
Figure 4:
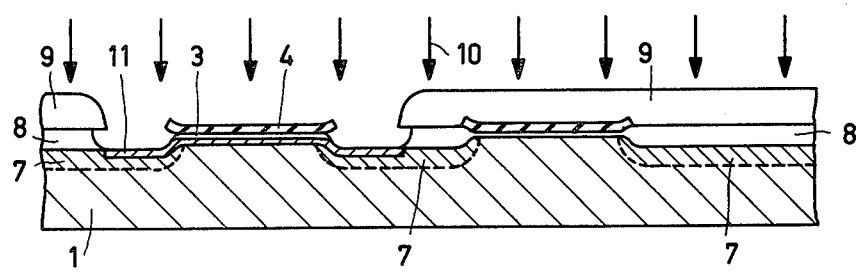
Figure 5:
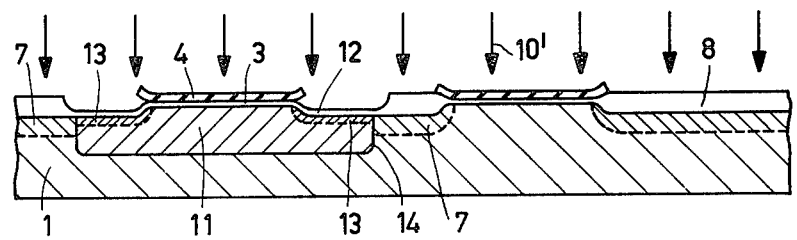
Figure 6:
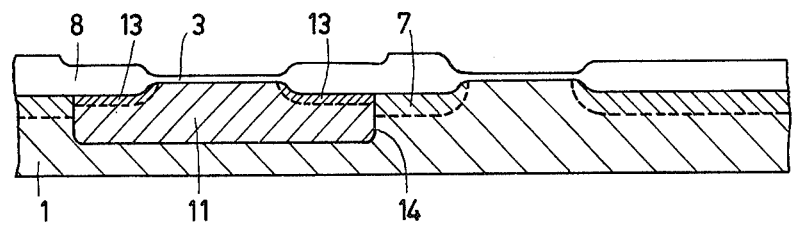

By thermal oxidation in a mixture of oxygen and hydrogen at 1150° C. for approximately 20 minutes an oxide layer 8 which is partly counter-sunk in the silicon body is formed in the surface parts not covered by the anti-oxidation mask (3, 4), see FIG. 3. The channel stopper zones 7 are diffused deeper in the body.

An etching mask 9 of photoresist is then formed which does not cover the anti-oxidation mask (3, 4) at the area of a first field effect transistor to be provided and an edge part of the oxide pattern surrounding said mask, and the parts of the oxide pattern 8 not covered by the mask 9 are removed by etching with a buffered HF solution. A boron-ion implantation 10 ($B^+_{11}$, 120 keV, $4 \times 10^{12}$ ions/$cm^2$) is then carried out (see FIG. 4). The ions penetrate through the layers 3 and 4 but do not penetrate into the regions underlying the photoresist mask 9. Said implantation serves to form the p-type region or "pocket" 11, which region 11, after removing the photoresist mask 9 in an oxygen plasma, is further indiffused at 1150° C. for approximately 15 hours. This diffusion takes place substantially entirely in nitrogen but begins at 900° C. for 7 minutes in oxygen, an approximately 30 nm thick oxide layer 12 being formed on the silicon surface (see FIG. 5).

After this diffusion step a further boron implantation is carried out to form a channel stopper zone 13 in the region 11. For this implantation are used $BF_2^+$ ions 10' with a dose of $3.5 \times 10^{13}$ ions per $cm^2$ and an energy of 65 keV. The ion doses to form the channel stopping zones 7 and 13 are chosen to be such that in the finished device the parasitic threshold voltage at which an inversion channel is formed via an insulated conductor path in the underlying silicon surface is approximately 15 Volts. The $BF_2{}^+$ implantation is masked by the layers 3, 4 and 8 but penetrates through the thin oxide layer The thickness of the oxide pattern 8 is then increased to approximately 900 nm by means of a further oxidation at 1000° C. for 6 hours, in which a further indiffusion of the region 11 (FIG. 6) takes place.

It is very important that during all the temperature treatments described so far the boundary of the region 11, at least in the proximity of the surface, does substantially not move in a lateral direction. This is because phosphorus and boron have substantially the same diffusion coefficients in silicon at the same temperature. The lateral diffusion of the adjoining zones 7 and 13 and 7 and 11, respectively, is thereby compensated for to a considerable extent, and the p-n junction 14 is substantially perpendicular to the surface at the edge of the region 11. The circumference of the "pocket" 11 therefore remains substantially coincident with the edge of the implantation window formed in the photoresist mask 9. The space occupied by the region 11 is thus considerably restricted as compared with known methods in which no boron-doped and phosphorus-doped channel stopper zones adjoining each other are used.

Figure 7:
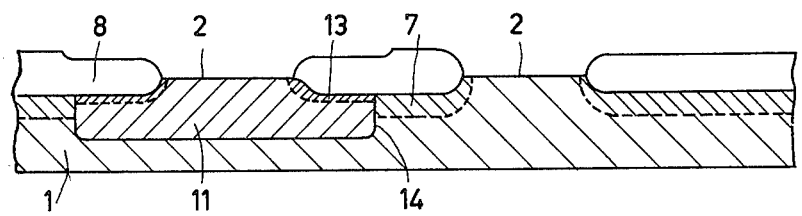
Figure 8:
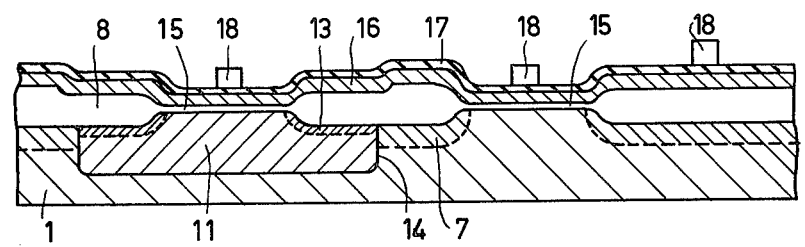

The nitride layer 4 is now removed in a plasma (see FIG. 6) and subsequently the remaining oxide layer 3 is removed by etching in a buffered HF solution. This latter etching process is continued until approximately 100 nm has been etched away from the oxide pattern (FIG. 7). As a result of this the edge of the oxide pattern becomes steeper, which in the subsequent process step leads to a better definition and reproducibility of the source and drain zones to be provided and avoid short-circuits.

This method of manufacturing the region 11 and the channel stopper zones 7 and 13 is not only of importance in connection with the example described here but is of advantage in all cases in which such a "pocket" structure with channel stopper zones is used.

Complementary insulated gate field effect transistors are now formed in the uncovered surface parts of the region 11 and the substrate region 1. For this purpose first a silicon oxide layer 15, the "gate oxide", is formed on said surface regions by means of thermal oxidation, see FIG. 8. The thickness of said layer is approximately 50 nm.

A polycrystalline doped silicon layer 16 is deposited on said oxide layer 15 by means of conventionally used methods. The silicon layer 16 has a thickness of approximately 300 nm. It is doped with phosphorus during the growth or afterwards until the sheet resistance is approximately 30 Ohm per square. In this example the doping of the layer 16 is carried out by means of diffusion from a mixture of $PH_3$ and oxygen in a diffusion furnace. After removing the phosphor glass layer formed, a very thin oxide layer in a thickness of approximately 15 nm (not shown in the Figure) is formed in the strongly n-type doped silicon layer 16 by means of a light thermal oxidation, and thereon a 55 nm thick silicon nitride layer is deposited. The silicon nitride layer with the underlying very thin oxide layer forms a masking layer protecting against oxidation, denoted in the figure by 17.

A photoresist mask 18 is then formed on the masking layer 17 in those places where a silicon pattern is to be formed from the layer 16, that is to say at the area of the gate electrodes and of the conductive connection paths or interconnections.

Figure 9:
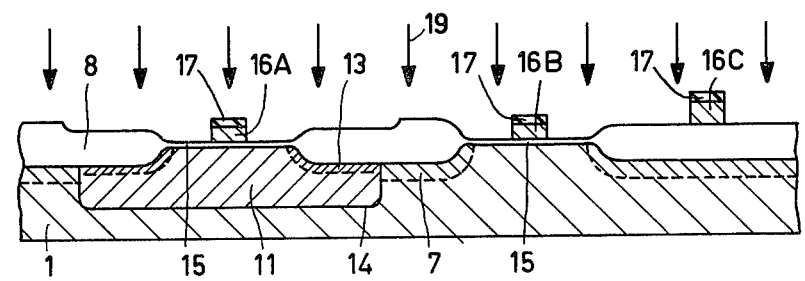
Figure 10:
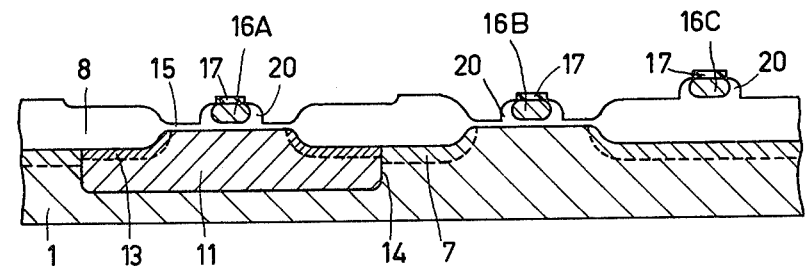

The masking layer 17 and the underlying silicon layer 16 are then etched into the form of a pattern with gate electrodes 16A and 16B and interconnections 16C, as shown in FIG. 9. Due to the small width dimensions of the silicon pattern, etching is preferably carried out entirely in a plasma.

After removing the photoresist mask 18 nitrogen ($N_2{}^+$) ions 19 are implanted in the parts of the silicon surface not underlying the silicon layer 16 in a dose of approximately $2.5 \times 10^{15}$ ions per $cm^2$ and an energy of 100 keV. Due to the small depth of the source and drain zones to be provided, the nitrogen ion dosage is chosen to be low, preferably between $2 \times 10^{15}$ and $3 \times 10^{15}$ ions per $cm^2$. The anti-oxidation action is then satisfactory and the crystal damage does not penetrate deeply into the silicon. The nitrogen ions penetrate through the oxide layer 15 into the silicon.

Thermal oxidation is then carried out in an oxygen atmosphere with approximately 13% hydrogen at 1050° C. for approximately 3 hours. The silicon regions implanted with nitrogen ions and comparatively weakly doped are substantially not oxidized. The edges of the silicon pattern not implanted and not covered by silicon nitride, however, are covered by a 300 nm thick oxide layer 20 (see FIG. 10).

Figure 11:
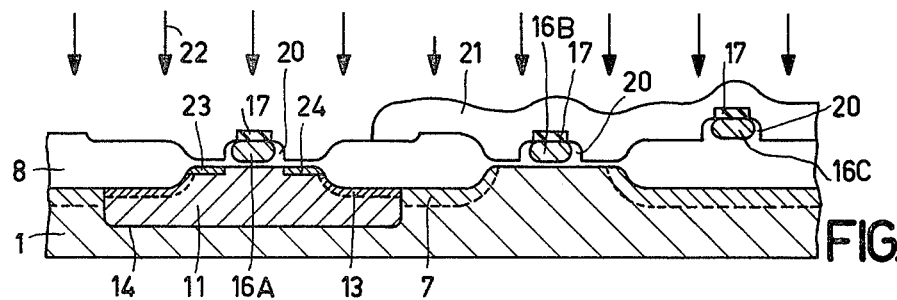
Figure 12:
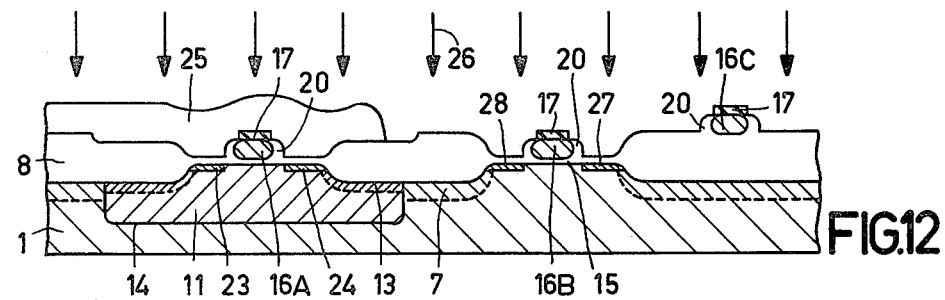

A non-critical photoresist mask 21 which covers at least the region of the p-channel transistor and does not cover the region of the n-channel transistor to be provided is then provided on the surface (FIG. 11). By implantation of arsenic ions 22 (dosage $2 \times 10^{15}$ $cm^{-2}$, energy 150 keV), the n-type source and drain zones (23, 24) of the n-channel transistor are formed in the region 11. The mask 21 is then removed in an oxygen plasma and a fresh, non-critical photoresist mask 25 is provided (see FIG. 12) which covers at least the region of the n-channel transistor and does not cover the region of the p-channel transistor. By implantation of $BF_2{}^+$ ions 26 (dosage $5 \times 10^{14}$ $cm^2$, energy 150 keV) the source and drain zones (27, 28) of the p-channel transistor are then formed. In the source and drain implantations the oxidized and silicon nitride-covered gate electrodes serve as an implantation mask.

Due to the small depth of penetration (approximately 0.2 μm) of the implanted source and drain zones, a separate masking for the implantation of the n-channel and the p-channel transistors is required.

Without removing the photoresist mask 25, in order to adjust the threshold voltage of the p-channel transistor, a further implantation, this time of $B_{11}{}^+$ ions, is carried out in the direction of the arrows 26 at such an energy, for example 180 keV, that the ions penetrate into the channel region through the masking layer 17 and through the gate electrode 16B and the oxide layer 15. Due to the comparatively small thickness of the layers 17 and 16 a low energy level will suffice for this purpose. The method according to the invention therefore provides the possibility of carrying out the implantation to adjust the threshold voltage without extra masking and only in one of the last few process steps.

Figure 13:
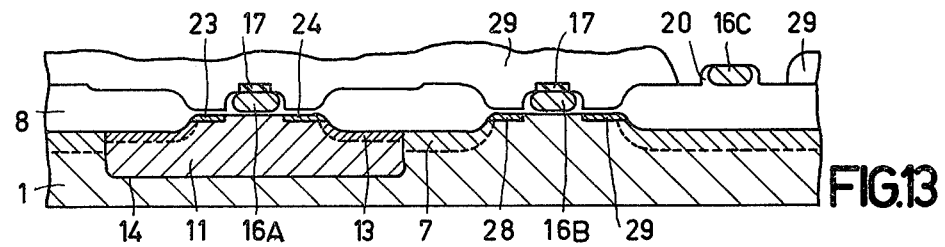
Figure 14:
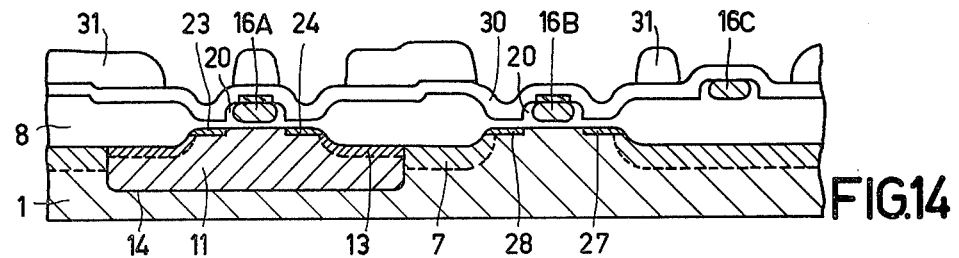

The photoresist mask 25 is again removed in an oxygen plasma and a fresh photoresist mask 29 is provided (see FIG. 13). The masking layer 17 is now removed by means of this mask in the places of the silicon pattern to be contacted, by etching away the silicon nitride layer in a plasma and by etching away the underlying 15 nm thick oxide layer in a buffered HF solution. The 300 nm thick oxide layer 20 at the edge of the silicon pattern 16 is maintained at least partly. After removing the photoresist mask 29 in an oxygen plasma, a further oxide layer, in the example a pyrolytically provided oxide layer 30, is then formed all over the surface, see FIG. 14. A gettering and diffusion step is then carried out, the implanted zones being annealed simultaneously and the source and drain zones obtaining the ultimate thickness of approximately 0.5 μm. For that purpose the silicon plate is heated for approximately 30 minutes at a temperature of 1000° C. in an atmosphere of $PH_3$, oxygen and nitrogen. In the subsequent step (see FIG. 14) a photoresist mask 31, the contact mask, is provided and in the thus recessed contact windows oxide layer 30 is removed at the surface of the source and drain zones and in the places of the silicon pattern to be contacted, and after removing the photoresist mask 31 the metallization is provided in a known manner (see FIG. 15).

Figure 15:
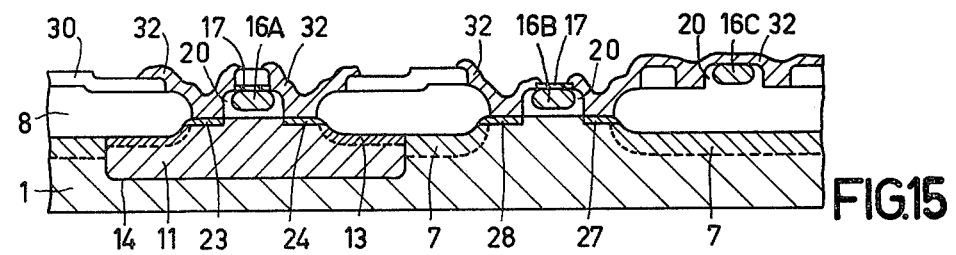
Figure 16:
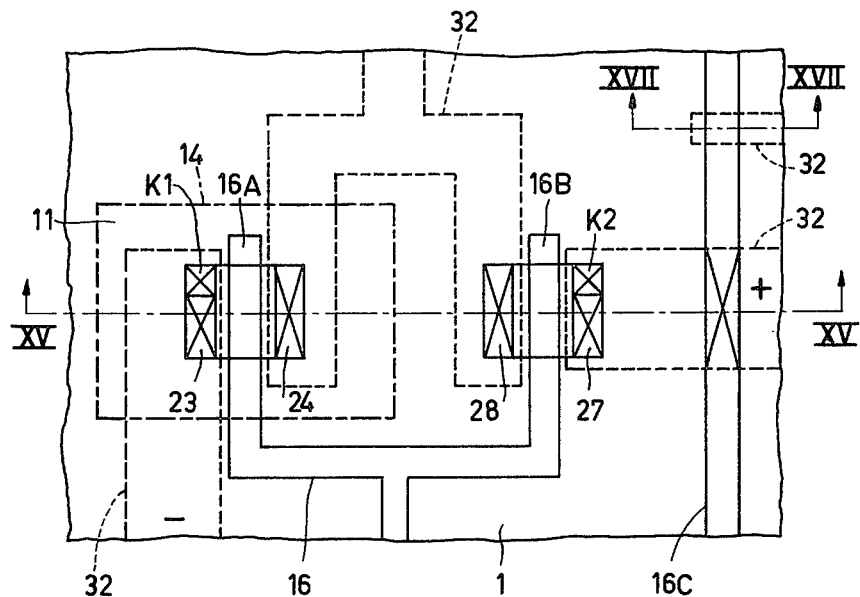
FIG. 16 is a diagrammatic plan view of the finished device, FIG. 15 being a sectional view taken on the line XV—XV.

FIG. 15 is a plan view and FIG. 16 is a cross-sectional view taken on the line XV—XV of FIG. 16 of the ultimately-obtained structure. In FIG. 16 the contours of the metallization 32 are shown in broken lines and the contours of the silicon pattern 16 are shown in solid lines. The contact windows are denoted by diagonals. As appears from FIG. 16, regions K1 and K2 are recessed in the source zones 23 and 27, in which recesses the "pocket" 11 and the substrate region 1, respectively, both emerge at the surface and are contacted there by the source metallization. Advantageously the metallization is of aluminum which contains 0.5% silicon and is sputtered in a thickness of approximately 1.2 μm. The metal layer 32 may be defined, for example, by means of a photoresist mask and by plasma etching.

Figure 17:
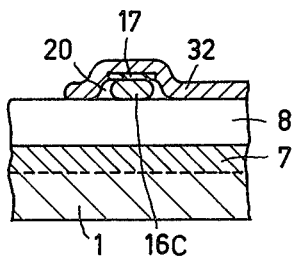
FIG. 17 is a sectional view of a detail taken on the line XVII—XVII of FIG. 16.

In certain circuit arrangements it may be of importance that a voltage-independent capacitor is present. The method according to this invention provides the possibility without requiring extra process steps. When, for example, the masking layer 17 on the conductor path 16C of polycrystalline silicon (FIG. 14) is not removed in a given place the metallization 32 may be provided on the nitride layer instead of directly on the silicon. See FIG. 17, which is a sectional view taken on the line XVII—XVII of FIG. 16. The structure (16C, 17, 32) then forms a voltage-independent capacitor with 16C and 32 as capacitor plates and the layer 17 as a dielectric.

Although in the above example the manufacture has been described of complementary field effect transistors, the method according to the invention in which both a nitrogen-ion implantation and masking with silicon nitride are used in a suitable combination as an anti-oxidation agent, may also be used for the manufacture of devices having only n-channel or only p-channel transistors. Nor is the invention restricted to the manufacture of transistors of the enhancement type. When, for example, prior to providing the oxide layer 15 a surface channel layer of the same conductivity type as the source and drain zones is implanted in the free silicon surface, the further process steps may be carried out in the same manner as in the above described example to manufacture a field effect transistor of the depletion type.

The method according to the invention is in particular of importance in connection with the use of an at least partly counter-sunk oxide pattern 1 as described with reference to the Figures. As a result of this a high packing density is obtained. However, the invention may also be used advantageously in the absence of such a countersunk oxide pattern.

Instead of the silicon nitride layers, oxidation-preventing layers may also be used which do not consist exclusively of $Si_3N_4$, for example, silicon oxide nitride layers, which in addition to $Si_3N_4$ also contain oxygen.

What is claimed is:

1. A method of manufacturing a semiconductor device having at least one insulated gate field effect transistor, which comprises:
   providing a silicon semiconductor body having a major surface;
   providing a silicon oxide layer on said major surface;
   providing a doped silicon layer on said oxide layer;
   providing a silicon-nitride-containing masking layer on said silicon layer;
   etching said masking layer and said underlying silicon layer into a pattern comprising at least a gate electrode;
   implanting nitrogen ions into those parts of the silicon surface not underlying the silicon layer;
   oxidizing the exposed parts of the silicon pattern by thermal oxidation, said masking layer masking the underlying silicon layer against said thermal oxidation; and
   forming source and drain zones by ion implantation in parts of the silicon surface not underlying the silicon pattern.

2. A method as claimed in claim 1, characterized in that said masking layer comprises a thermal oxide layer on the silicon layer and a silicon nitride layer on said thermal oxide layer.

3. A method as claimed in claim 1 or 2, characterized in that at a location other than that of the field effect transistor said masking layer is covered with a conductive layer which together with the underlying silicon layer forms the plates of a voltage-independent capacitor, said masking layer forming the dielectric of said capacitor.

4. A method as claimed in claims 1 or 2, characterized in that in order to adjust the threshold voltage of the field effect transistor ions are implanted through said masking layer and said gate electrode into the channel region.

5. A method as claimed in claim 2, characterized in that the thickness of said thermal oxide layer is at most 20 nm, that of said silicon nitride layer is at most 60 nm and that of said silicon layer is at most 350 nm.

6. A method as claimed in claim 1 or 2, characterized in that the nitrogen ion implantation is carried out with a dose of at least $2 \times 10^{15}$ ions/cm$^2$ and at most $3 \times 10^{15}$ ions/cm$^2$.

7. A method as claimed in claim 1 or 2, characterized in that after the formation of the source and drain zones a further insulating layer is provided on the surface, after which contact windows are etched in said further insulating layer.

8. A method as claimed in claim 7, characterized in that before providing the further insulating layer said masking layer is locally removed from the silicon pattern.

9. A method as claimed in claim 1 or 2, characterized in that two complementary insulated gate field effect transistors are manufactured in which around each of the transistors an at least partly countersunk oxide pattern is formed and in which the first transistor is provided in a substrate region of a first conductivity type and the second transistor is formed in a region of the second, opposite conductivity type which within the semiconductor body is surrounded entirely by the substrate region and forms therewith a p-n junction terminating at the oxide pattern.

10. A method as claimed in claim 9, characterized in that the starting material is an n-type silicon substrate, that an antioxidation mask is provided on the surface at the area where the field effect transistor is to be formed, that the non-masked surface regions are then exposed to a phosphorus ion implantation and are then thermally oxidized to form a partly countersunk oxide pattern, that an etching mask is then provided which at the area of the first transistor does not cover the antioxidation mask and an edge region of the oxide patern situated therearound, that the uncovered part of the oxide pattern is then removed by etching and a first boron implantation is carried out through the anti-oxidation mask and into the region not covered by the etching mask, and, after removing the etching mask, the boron atoms are further indiffused, after which a second boron implantation with a higher dosage and lower energy then the first boron implantation is carried out in the region not covered by the anti-oxidation mask and the oxide pattern, that the oxide pattern is then completed by means of a further thermal oxidation, after which the surface regions present below the anti-oxidation mask are exposed and the field effect transistors are provided in said regions.

* * * * *